United States Patent
Morishita

(10) Patent No.: US 6,784,492 B1
(45) Date of Patent: Aug. 31, 2004

(54) SEMICONDUCTOR DEVICE INCLUDING A GATE-INSULATED TRANSISTOR

(75) Inventor: Masakazu Morishita, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/250,942

(22) Filed: May 31, 1994

Related U.S. Application Data

(63) Continuation-in-part of application No. 07/852,710, filed on Mar. 17, 1992, now abandoned.

(30) Foreign Application Priority Data

Mar. 18, 1991 (JP) .............................. 3-052426
Mar. 18, 1991 (JP) .............................. 3-052429

(51) Int. Cl.[7] .................. H01L 27/01; H01L 29/76; H01L 29/94; H01L 31/062
(52) U.S. Cl. ................ 257/347; 257/346; 257/402; 257/403; 257/345
(58) Field of Search ................. 257/347, 350, 257/351, 353, 346, 402, 403, 66, 345

(56) References Cited

U.S. PATENT DOCUMENTS

| | | | | |
|---|---|---|---|---|
| 4,000,504 A | * | 12/1976 | Berger ..................... | 257/300 |
| 4,219,829 A | * | 8/1980 | Dorda et al. ............... | 257/403 |
| 4,276,095 A | * | 6/1981 | Beilstein, Jr. et al. ...... | 257/403 |
| 4,575,746 A | * | 3/1986 | Dingwall .................. | 257/353 |
| 4,701,775 A | * | 10/1987 | Cosentino et al. .......... | 257/403 |
| 4,819,043 A | * | 4/1989 | Yazawa et al. ............. | 257/346 |

FOREIGN PATENT DOCUMENTS

| | | | | |
|---|---|---|---|---|
| JP | 57-31177 | * | 2/1982 | ............ 257/66 |
| JP | 60-50960 | * | 3/1985 | ............ 257/403 |

* cited by examiner

*Primary Examiner*—Steven Loke
(74) *Attorney, Agent, or Firm*—Fitzpatrick, Cella, Harper & Scinto

(57) ABSTRACT

A semiconductor device comprises at least a semiconductor layer including source and drain areas of a first conductive type and of a high impurity concentration and a channel area positioned between the source and drain areas, an insulation layer covering at least the channel area, and a gate electrode positioned close to the insulation layer. The channel area at least comprises a first channel area of a low resistance, positioned close to the insulation layer and having a second conductive type opposite to the first conductive type, and a second channel area of a high resistance, having the first conductive type and positioned adjacent to the first channel area.

6 Claims, 16 Drawing Sheets

F I G. 8
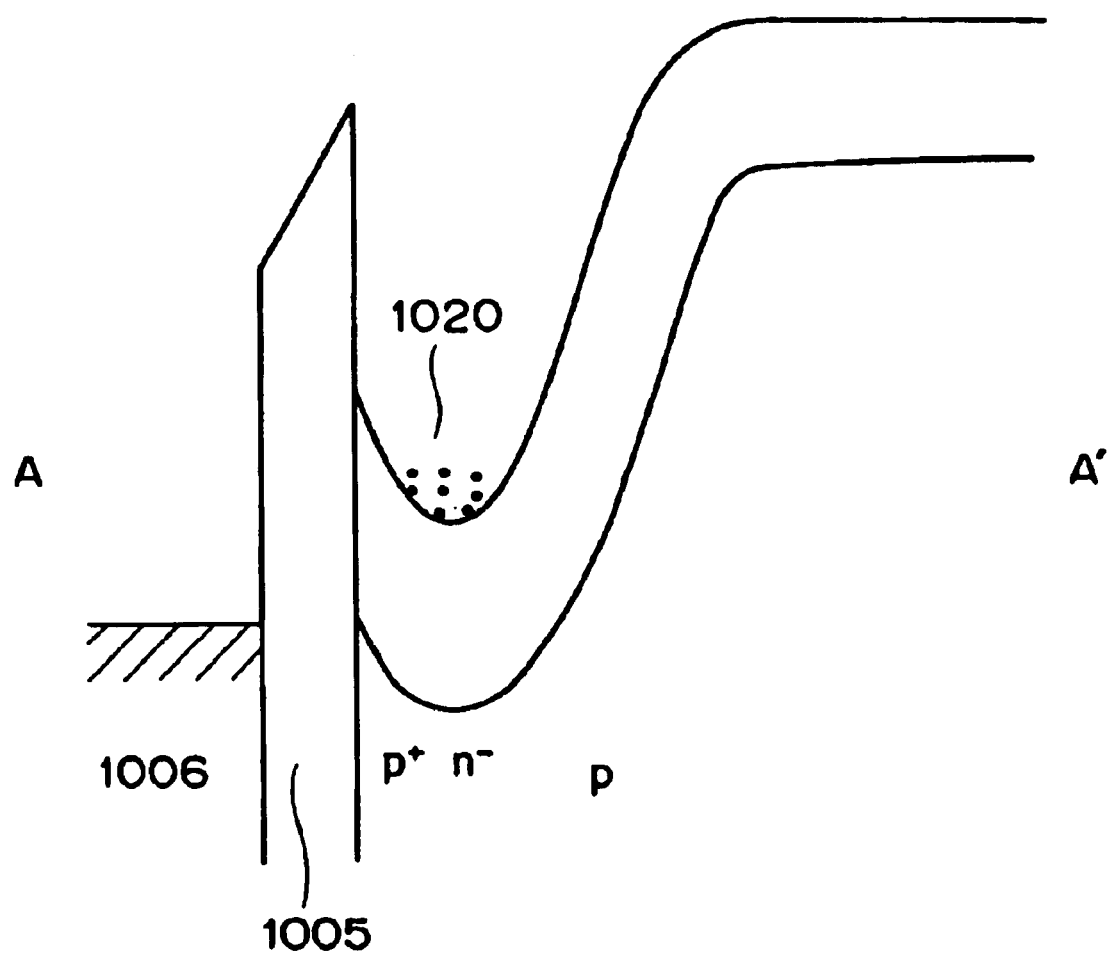

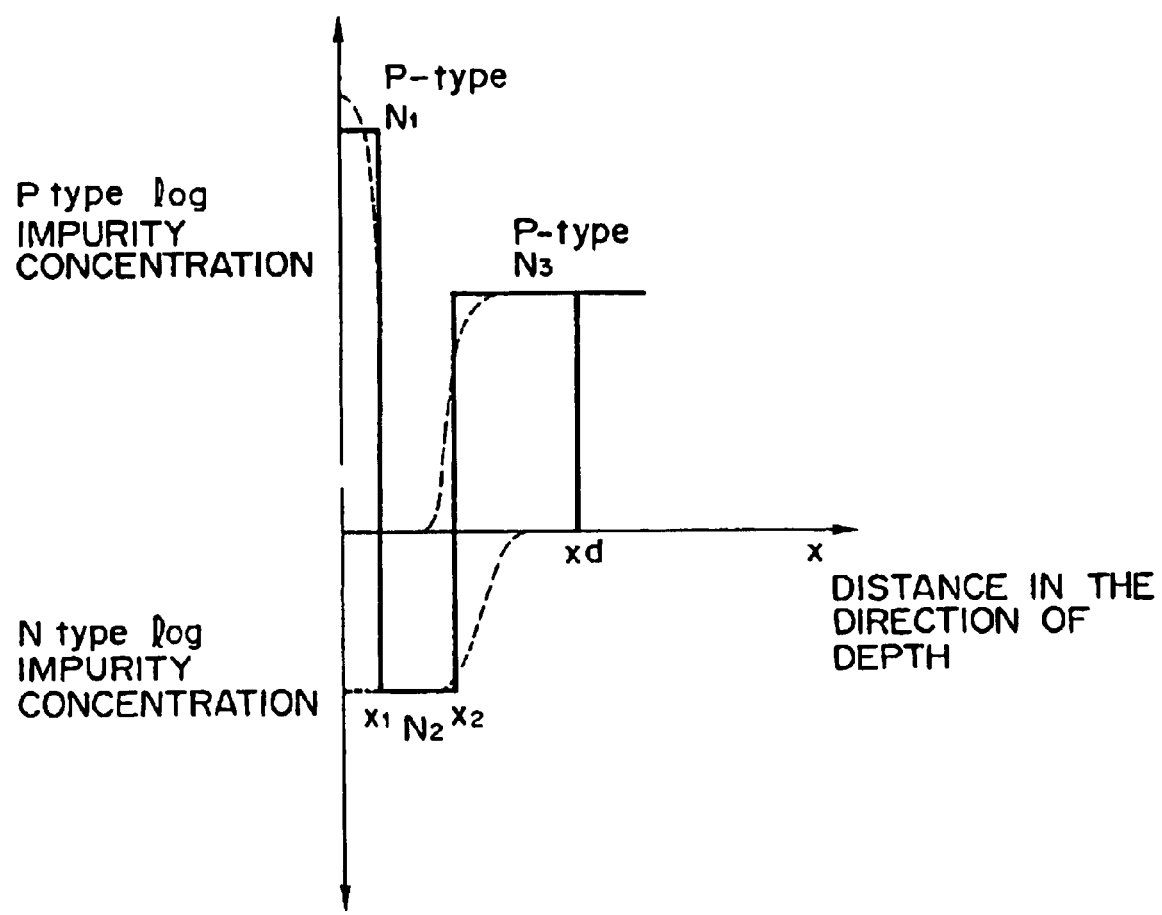
F I G. 12

F I G. 14
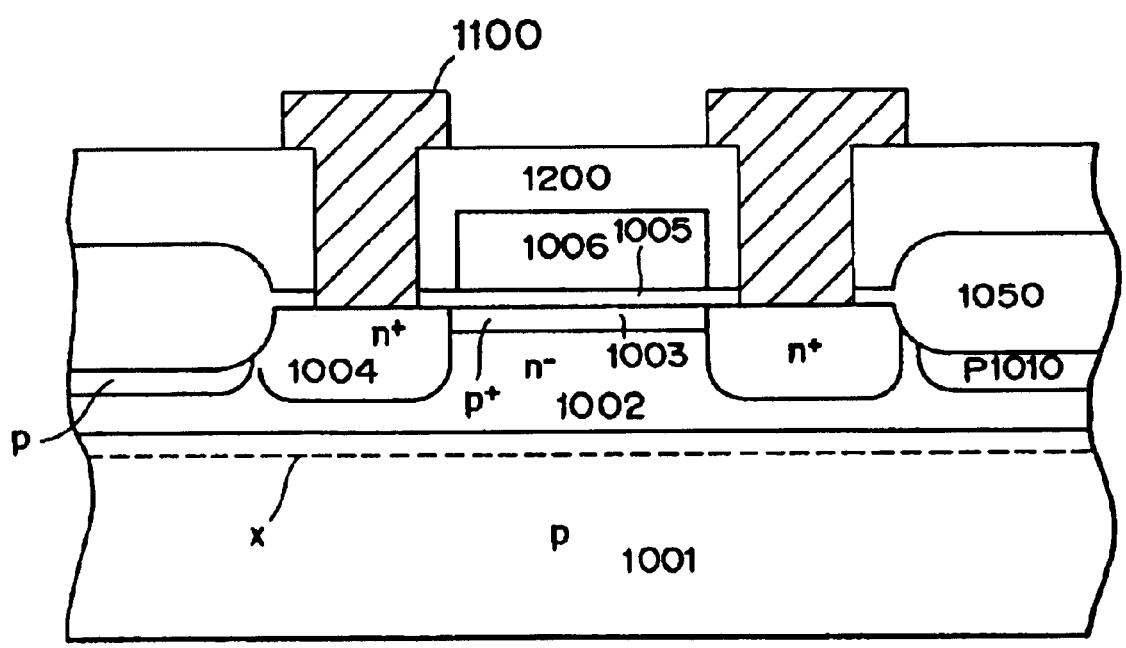

F I G. 15
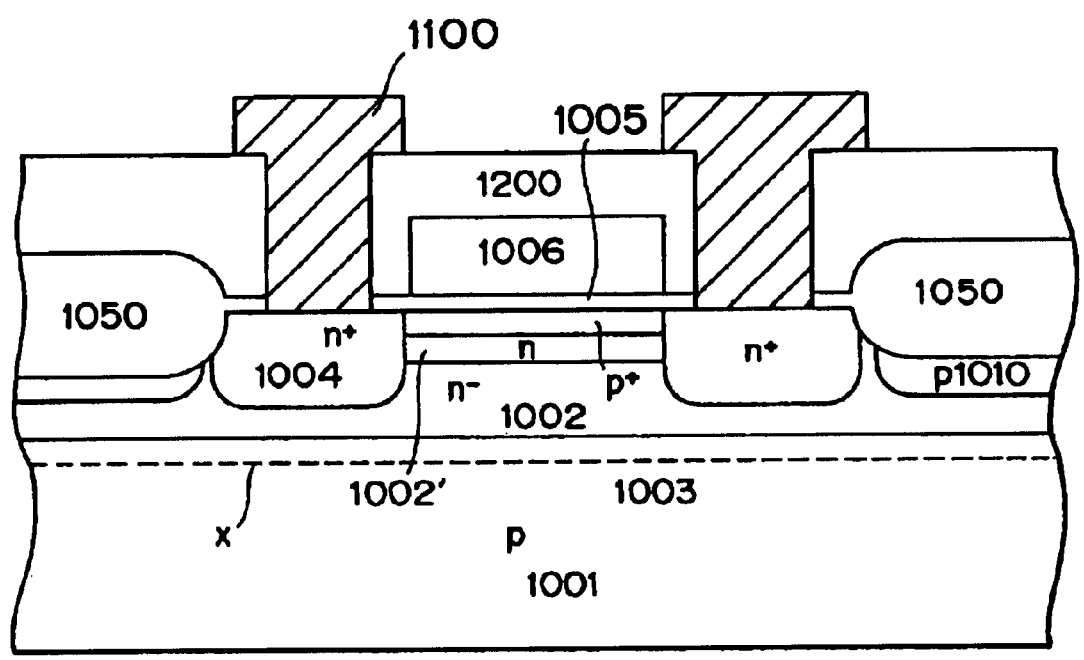

SEMICONDUCTOR DEVICE INCLUDING A GATE-INSULATED TRANSISTOR

This application is a continuation of application Ser. No. 07/852,710 filed Mar. 17, 1992, now abandoned.

BACKGROUND OF THE INVENTION

1. Field of the Invention

The present invention relates to a semiconductor device, and more particularly to a semiconductor device including a gate-insulated transistor.

2. Related Background Art

MOS transistors are already known among gate-insulated transistors, and the enhancement MOS transistor is known among such MOS transistors.

A low carrier mobility is induced, for example, by ion scattering (Coulomb scattering) resulting from impurity, scattering caused by coarse interface between an insulator and a semiconductor, and a disperse scattering resulting from an electric field perpendicular to the surface.

In a MOS transistor, the carriers are generated in an inversion channel with a width as narrow as about 100 Å, having a steep electric field $E_V$ perpendicular to the surface, so that the carrier mobility is easily in the level of $10^6$ V/cm. The carrier mobility is therefore directly influenced by such electric field, and becomes lower than the mobility specific to the semiconductor. FIG. 11 shows the relation between the carrier mobility and the perpendicular electric field $E_V$. The mobility is principally governed by the Coulomb scattering under a weak electric field, by the phonon scattering under a medium electric field, and by the scattering caused by surface coarseness under a strong electric field. Though the mobility $\mu$ of electrons in the silicon semiconductor itself is about 1500 cm$^2$/V·sec at a temperature of about 300° K., the mobility in a MOS transistor is 300–700 cm$^2$/V·sec at maximum under the medium to high electric field corresponding to the functioning condition of the transistor.

For this reason, in case of forming a MOS transistor with SOI technology, it has been tried to form an extremely thin semiconductor layer, thereby depleting the channel area and thus suppressing the dispersion scattering and impurity scattering. It has however been difficult technically to sufficiently reduce the influence of the coarseness of interface or to stably produce the channel layer with a thickness not exceeding 500 Å.

SUMMARY OF THE INVENTION

An object of the present invention is to provide a semiconductor device which reduces the interface scattering, dispersion scattering and Coulomb scattering, thereby increasing the carrier mobility, whereby the conversion conductance $g_m$ becomes larger and the response speed becomes faster.

Another object of the present invention is to provide a semiconductor device which can achieve relaxation of the electric field at the drain side, thereby reducing the hot carrier generation and also reducing the deterioration in the drain breakdown voltage and the Kimpf effect specific to the SOI structure.

Still another object of the present invention is to provide a semiconductor device showing a large carrier mobility even with a large thickness of the channel layer and being therefore adapted to mass production.

Still another object of the present invention is to provide a semiconductor device with a lowered impurity concentration of the channel in the carrier conduction area, for the purpose of eliminating Coulomb scattering.

Still another object of the present invention is to provide a semiconductor device in which the intensity of the perpendicular electric field in the carrier conduction area is lowered and the carrier conduction area is widened, thereby reducing the dispersion scattering.

Still another object of the present invention is to provide a semiconductor device in which the carriers are excluded in the vicinity of the interface between the gate insulation film and the semiconductor, whereby the influence of coarseness of said interface is excluded.

Still another object of the present invention is to provide a semiconductor device of a low parasite capacitance, in which the channel area is made thicker to enable stable mass production while retaining characteristics of the SOI device.

Still another object of the present invention is to provide a MOS transistor with improved carrier mobility which is an important parameter determining the characteristics of the transistor.

BRIEF DESCRIPTION OF THE DRAWINGS

FIG. 8 is a view showing potential distribution along a line A–A' in FIG. 7;

FIG. 12 is a schematic view showing impurity distribution along a direction A–A' in FIG. 7;

FIG. 14 is a schematic cross-sectional view of a fifth embodiment of the present invention;

FIG. 15 is a schematic cross-sectional view of a sixth embodiment of the present invention.

DESCRIPTION OF THE PREFERRED EMBODIMENTS

The above-mentioned objects can be attained, according to the present invention, by a semiconductor device provided at least with source and drain areas of a first conductive type, having a high impurity concentration and formed on an insulation film, a channel area positioned between said source and drain areas, an insulation layer covering at least said channel area, and a gate electrode positioned close to said insulation layer, wherein said channel area includes a first channel area of a low resistance having a second conductive type opposite to said first conductive type and positioned close to said insulation layer, and a second channel area of a high resistance having the first conductive type and positioned adjacent to said first channel area.

The above-mentioned structure enables drifting of carriers in an area distant from the interface between the gate insulation film and the semiconductor, and realizes a gentle slope of the electric field in the carrier drifting area.

In the following the present invention will be clarified in detail with reference to the attached drawings.

Embodiment 1

Figure 1:
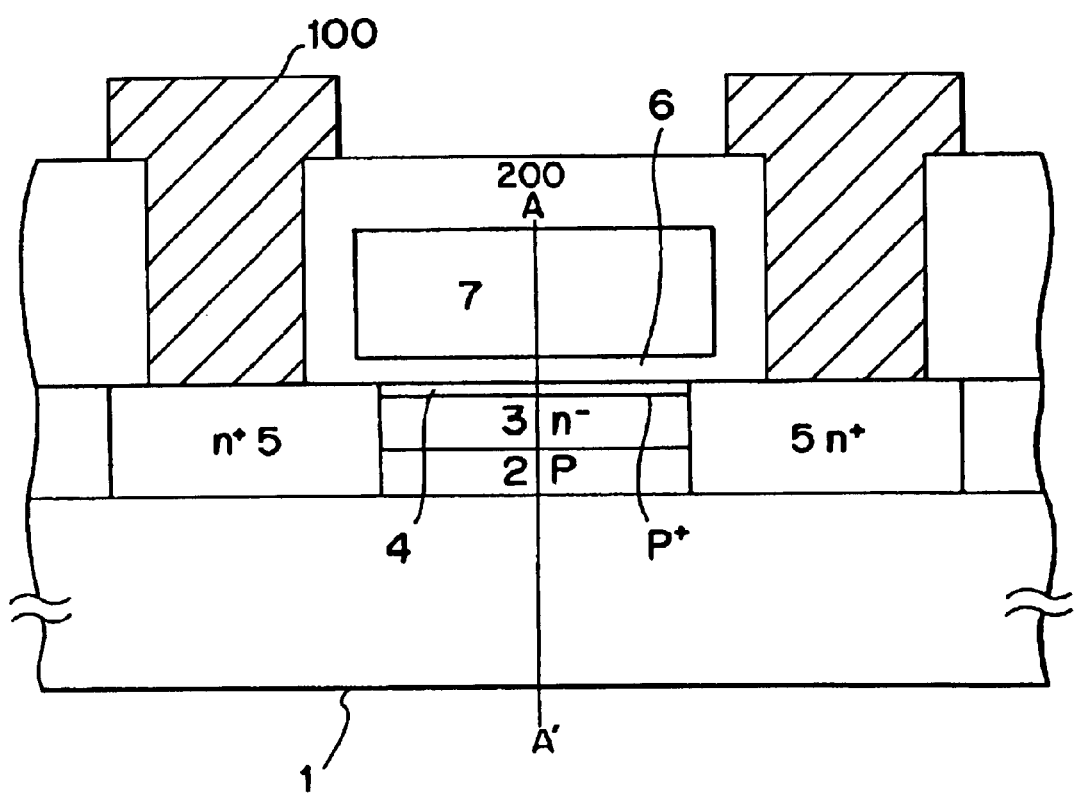
FIG. 1 is a schematic cross-sectional view of a semiconductor device constituting a first embodiment of the present invention.

FIG. 1 is a schematic cross-sectional view of an MOS transistor of the present invention.

An insulating substrate 1 is composed of an insulating substance such as quartz or sapphire or an insulating layer formed on a semiconductive or conductive substrate.

A p-area 2 constitutes a part of the channel area and contains impurity capable of controlling the conductivity. In case of silicon semiconductor, such impurity is preferably an element belonging to the group III of the periodic table, such as boron. The concentration of such impurity is preferably within a range of $10^{14}$–$10^{18}$ cm$^{-3}$.

An n$^-$-area 3 contains, when necessary, impurity capable of controlling the conductive type. In case of silicon semiconductor, such impurity is preferably an element belonging to the group V of the periodic table, such as phosphor. The concentration of such impurity is preferably within a range not exceeding $1 \times 10^{17}$ cm$^{-3}$, in order to prevent deterioration of carrier mobility resulting from Coulomb scattering.

A p$^+$-area 4 has a higher impurity concentration than in the area 3, in order to prevent confinement of the inverted carriers in an area in the vicinity of the surface. The impurity concentration is preferably within a range of $10^{15}$–$10^{19}$ cm$^{-3}$.

An n$^+$-area 5 constitutes the source or drain of the MOS transistor and has an impurity concentration preferably within a range of $10^{18}$–$10^{21}$ cm$^{-3}$.

A gate insulation film 6 of the MOS transistor is composed of an insulating material such as $SiO_2$, $Si_3N_4$, $TiO_2$ or $TaO_2$ or combinations thereof.

A gate electrode 7 can be composed of p$^+$- or n$^+$-polysilicon, silicide, polycide or a metal (preferably high-melting metal).

An insulation film 200, for separating the wirings and different layers, can be composed of the same material as that of the above-mentioned gate insulation film. Areas 100, constituting electrodes and wirings of the source and drain, can be composed for example of Al, Al—Si, copper, polysilicon or silicide.

Figure 2:
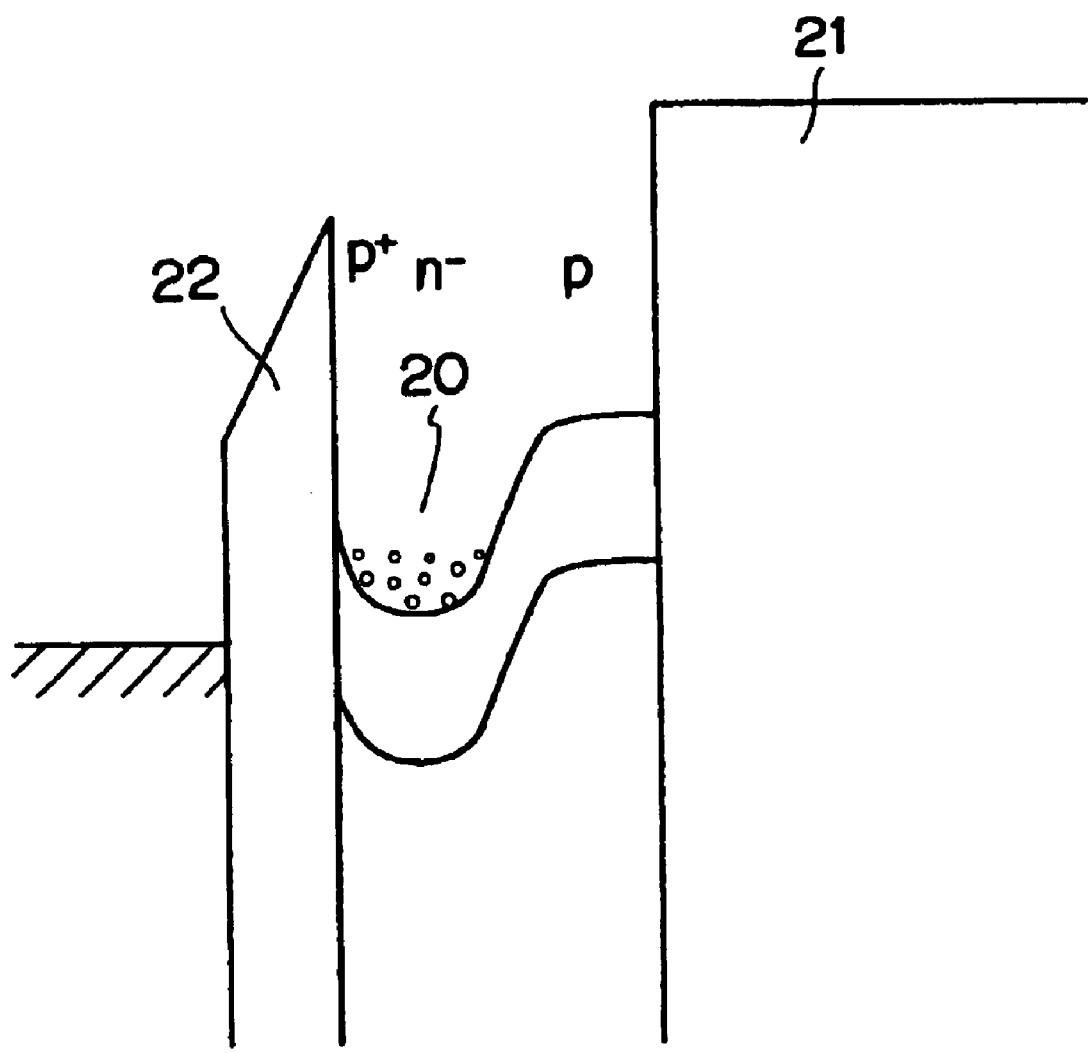
FIG. 2 is a view showing potential distribution along a line A–A' in FIG. 1.

FIG. 2 schematically illustrates the potential distribution along a line A–A' in FIG. 1. There are shown electrons 20 constituting carriers; the gate insulation film 22 and the insulating substrate 21. The important features of the present invention are that (1) the carrier electrons drift in an area separate from the interface between the gate insulation film 22 and the semiconductor, (2) the drifting area of the carriers 20 has a gentle slope of electric field toward the gate surface, and (3) the carrier drift area has a low impurity concentration.

The MOS transistor is easier to use in the normally off type, and, in such case, the thickness of the n$^-$-area 3 and the impurity concentration become important. The thickness of depletion layer spreading in the n-area of a pn junction can be represented by:

$$X_n = \sqrt{\frac{2\varepsilon_s}{q} \frac{N_A}{N_D} \frac{V_{bi}}{(N_A + N_D)}} \tag{1}$$

wherein $V_{bi}$: diffusion potential, $N_A$, $N_D$: impurity concentrations of p, n type respectively, $\varepsilon_s$: dielectric constant of semiconductor, q: charge.

For the impurity concentration $N_{A1}$, $NA_{A2}$ respectively for the areas 2, 4, the thickness of the area 3 with a fixed impurity concentration $N_D$ has to satisfy the following relationship:

$$x_n(N_D) \leq x_{n1}(N_D, N_{A1}) + x_{n2}(N_D, N_{A2}) \tag{2}.$$

This relationship however stands when $\phi_{ms}$ is zero, and is given a certain correction when $\phi_{ms}$ has a finite value.

The p$^+$-area 4 of high impurity concentration at the surface needs to have a thickness at least equal to the mean free path of drifting carriers, in order to reduce the probability of scattering at the interface with the gate insulation film. More specifically, in case of silicon, said thickness is preferably selected equal to 50–100 Å or larger. The impurity concentration is preferably higher, by one digit or more, than that in the area 3. The semiconductor layer may be depleted to the interface between the semiconductor and the gate insulation film, or may remain neutral. FIG. 2 shows the former state. The carrier induction under the application of a voltage to the gate electrode should preferably take place, but in the area 3. In case of an n-area, free carriers can be easily generated in the area 3 if the Fermi level is above the center of the forbidden band. In case of a p-area, there is required a level of $-2\phi_F$ opposite to the inherent Fermi level $\phi_F$ in order to generate electrons which are of the opposite conductive type.

Figure 3:
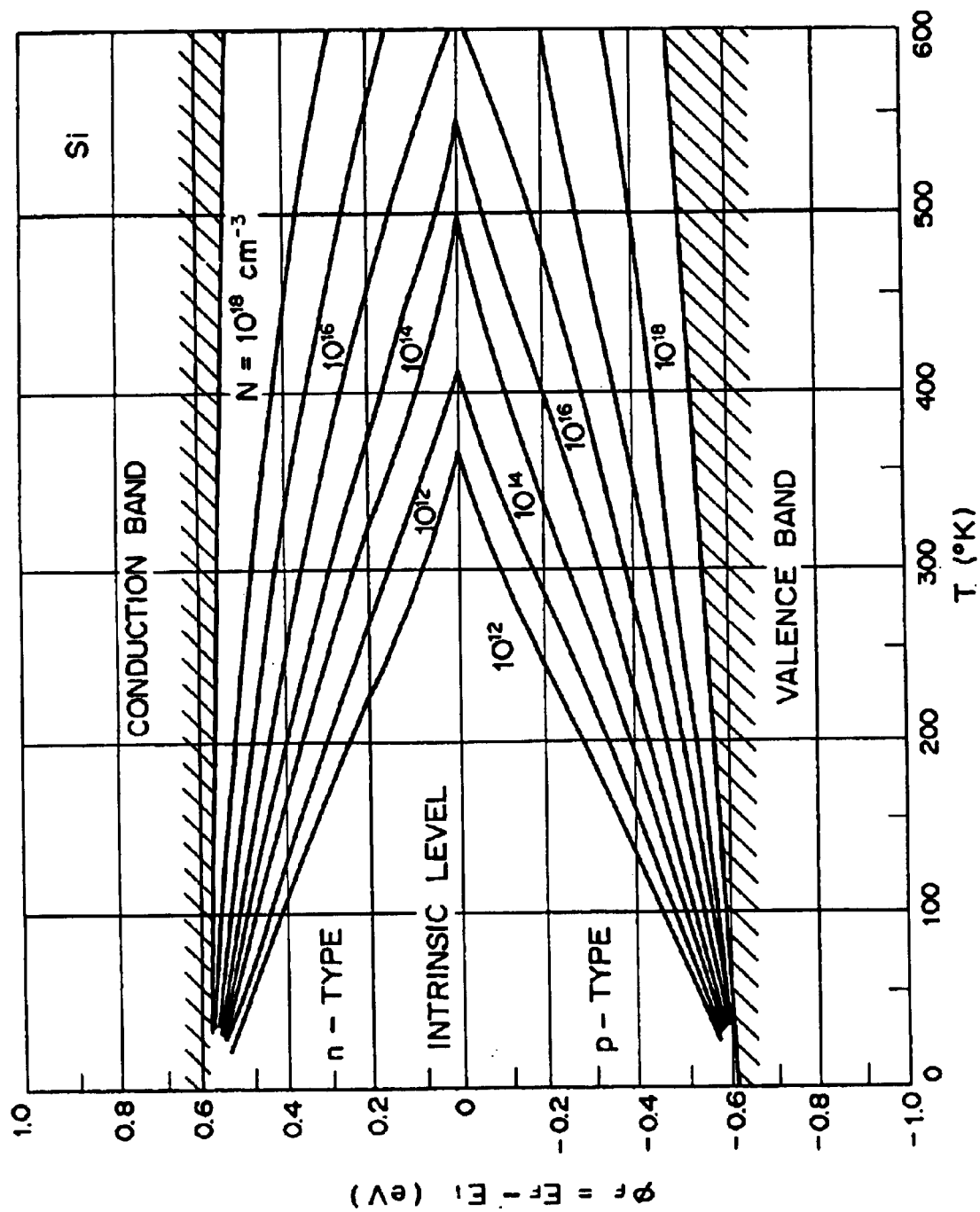
FIG. 3 is a chart showing the change in Fermi level as a function of temperature in silicon.

FIG. 3 shows the change of Fermi level in the ordinate as function of temperature (°K.) in the abscissa, in case of silicon, taking different n- and p-impurity concentrations as a parameter. In the n-area 3, if the Fermi level, represented by $\phi_F = E_F - E_i$, is positioned above the center of the forbidden band, the free carriers are supplied from the source of the MOS transistor. When $\phi_F = E_F - E_i$ becomes about 0.3 eV, there are supplied free carriers in the order of $10^{15}$ cm$^{-3}$. On the other hand, free carrier generation in the p$^-$-area 4, for example with an impurity concentration of $10^{18}$ cm$^{-3}$, requires a Fermi level of about +1.0 eV for reaching $-2\phi_F$.

In FIG. 2, the p-area 2 is illustrated to have a neutral area, but the depletion layer may reach the interface with the insulating substrate. In such case, however, the interface level at the interface between the area 2 and the insulating substrate 1 also affects the threshold voltage of the device.

Figure 4:
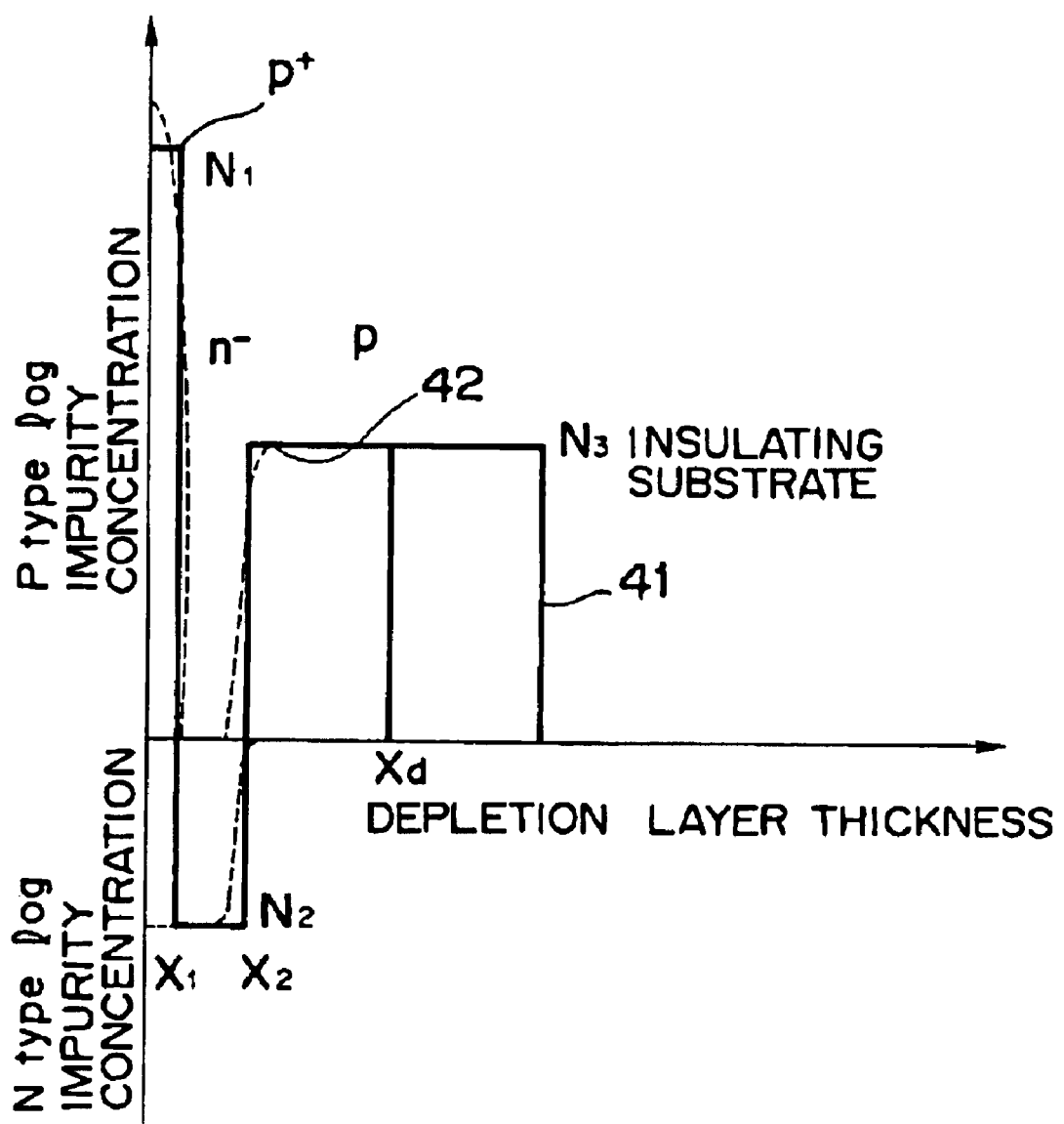
FIG. 4 is a schematic view showing impurity distribution along a direction A–A' in FIG. 1.

FIG. 4 schematically shows the impurity distribution along the cross section A–A' in FIG. 1. A solid line 41 indicates the ideal stepwise distribution, while a broken line 42 indicates the actual impurity distribution. The surfacial p$^+$-layer and the n$^-$- and p-area constituting carrier drifting area have the boundaries at the depths $x_1$, $x_2$, and the thickness of the depletion layer is indicated by $x_d$. The threshold voltage can be approximately determined in the following manner, taking integration $D_I$ of the impurity in two surfacial areas:

$$D_I = \int_0^{x_d} (N_1(x) - N_2(x)) dx \quad (3)$$

$$\Delta v_{th} = qD_I/C_i \text{ (wherein } C_i = \epsilon_s/Tox) \quad (4)$$

Tox is a thickness of an oxide film. The equation (4) allows to approximately determine the variation in the threshold voltage. This equation; stands, however, when the thickness $X_d$ of the depletion layer is larger than $x_2$ and the surfacial p$^+$-layer is depleted. The final threshold value can be represented as:

$$V_{th}V_{th}(N_3) + \Delta V_{th} + \Delta \phi N_3 N_2 \quad (5).$$

This corresponds to a shift of $V_{th}(N_3)$, determined by the impurity concentration $N_3$ of the p-area 2, by $\Delta V_{th}$. $\Delta \phi N_3 N_2$ is a diffusion potential difference at a thermal equilibrium state.

A condition $\Delta V_{th} = 0$ can be easily achieved by selecting $N_1$, $N_2$, $x_1$ and $x_2$ so as to attain $D_I = 0$. In this state, the $V_{th}$ can be determined by the impurity concentration of the substrate and $\Delta \phi N_3 N_2$. Also the difference $\phi_{ms}$ in Fermi levels between the semiconductor and the electrode material varies according to said material to be employed, but the threshold value can be accordingly controlled with the thickness and impurity concentration of the surfacial p$^+$-layer, employing the equation (4).

However the foregoing relations are applicable when the thickness $x_d$ of the depletion layer does not reach the interface between the area 2 and the insulating substrate. If the depletion reaches said interface, the threshold value is determined by the impurity concentrations and thicknesses of the areas 2, 3 and 4.

In the following explained is an example of process for producing the semiconductor device shown in FIG. 1.

On a quartz glass substrate 1, a recess is formed, and p-type single crystal is formed therein. The crystal protruding from said recess is removed by selective grinding, whereby a Si area is formed in the recess (area 2 is formed therein).

Then the area 3 is formed by implanting an n-impurity such as phosphor or arsenic into the semiconductor area with a concentration of $1 \times 10^{11} - 1 \times 10^{14}$ cm$^{-2}$, followed by heat treatment.

After the gate oxide film 6 of a thickness of 50–1000 Å is formed by thermal oxidation, the surfacial p$^+$-area 4 is formed by ion implantation of BF$_2^+$ with a dose of $1 \times 10^{11} - 1 \times 10^{14}$ cm$^{-2}$ and with an acceleration voltage of 5–100 keV.

Then, after polysilicon is deposited by LPCVD, boron is introduced as p-type impurity by ion implantation or thermal diffusion, and the polysilicon is patterned with photoresist, thereby forming the gate electrode 7.

Then, n-impurity such as phosphor or arsenic is ion implanted with a dose of $1 \times 10^{15} - 1 \times 10^{16}$ cm$^{-2}$, utilizing the gate electrode 7 as a mask, and heat treatment is thereafter conducted to form the n$^+$-areas 5 constituting the source and drain.

Thereafter a silicon oxide film is deposited as an interlayer insulation film, then contact holes are opened by patterning, and a metal such as Al or Al—Si is deposited and patterned to form electrodes and wirings. The semiconductor device is completed in this manner.

Embodiment 2

Figure 5:
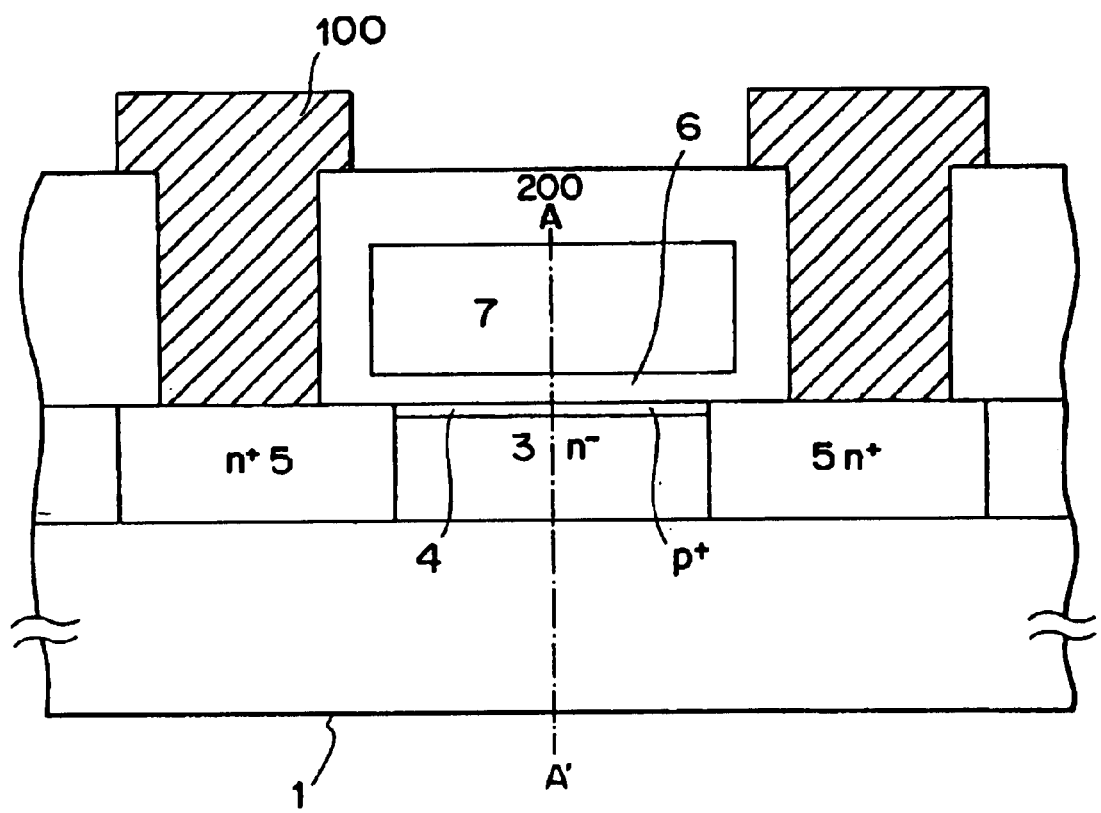
FIG. 5 is a schematic cross-sectional view of a semiconductor device constituting a second embodiment of the present invention.

FIG. 5 is a schematic cross-sectional view of a second embodiment.

This embodiment is different from the foregoing embodiment in that the area 3 reaches the interface between the semiconductor layer and the insulating substrate, without formation of the aforementioned area 2.

This embodiment functions in a similar manner to the first embodiment, since the carriers can be confined in an area close to the junction between the areas 4 and 3. Because of the simpler structure, the manufacturing process for the present embodiment can be made shorter than that of the 1st embodiment. However, in the normally-off device, the impurity concentration and thickness of the area 3 are determined by the aforementioned equation (1). Also the depletion layer extending from the area 4 has to reach the lower interface under zero gate bias.

Embodiment 3

Figure 6:
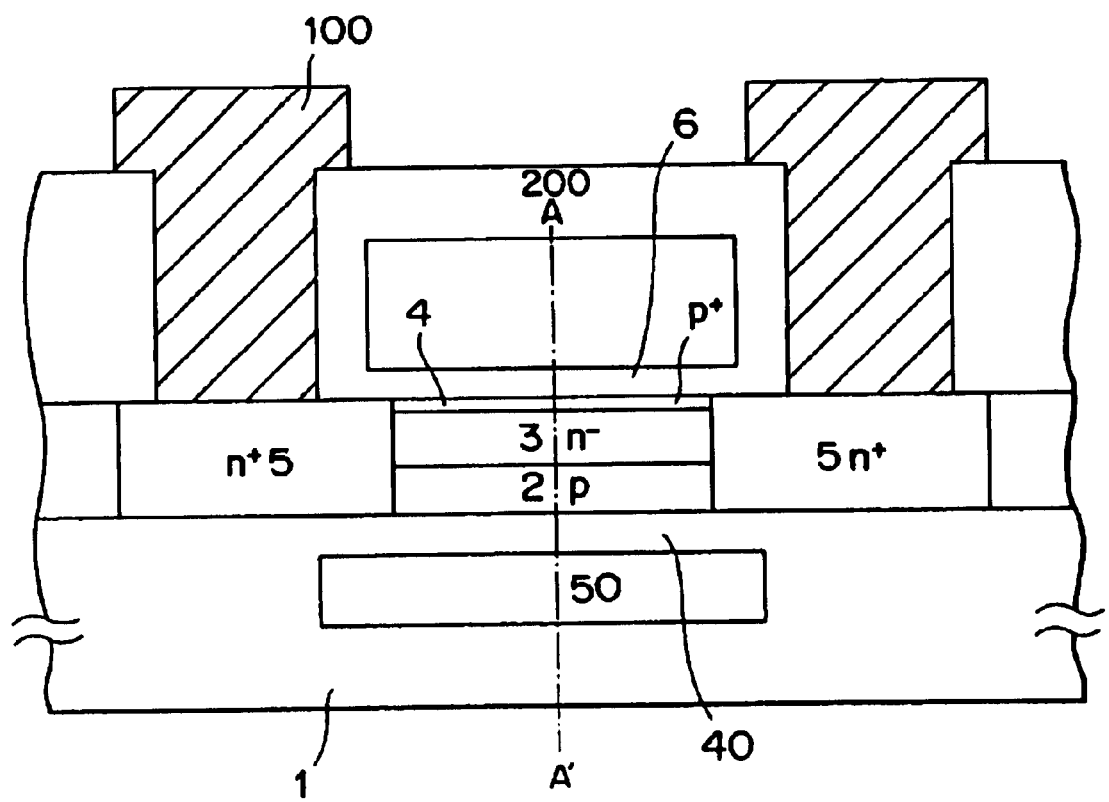
FIG. 6 is a schematic cross-sectional view of a semiconductor device constituting a third embodiment of the present invention.

FIG. 6 is a schematic cross-sectional view of a third embodiment, which is featured by a double gate structure having a second gate electrode 50 and a second gate insulation film 40 in the insulating substrate. Such double gate structure enables more stable function.

The foregoing 1st to 3rd embodiments are explained on NMOS transistors, but the concept of the present invention is naturally applicable to a PMOS transistor, by interchanging the n and p types in the foregoing embodiments.

Also the present invention is applicable not only to silicon mentioned above but also to other semiconductive materials, and the crystalline state thereof may be suitably selected such as monocrystalline, polycrystalline or amorphous.

Embodiment 4

Figure 7:
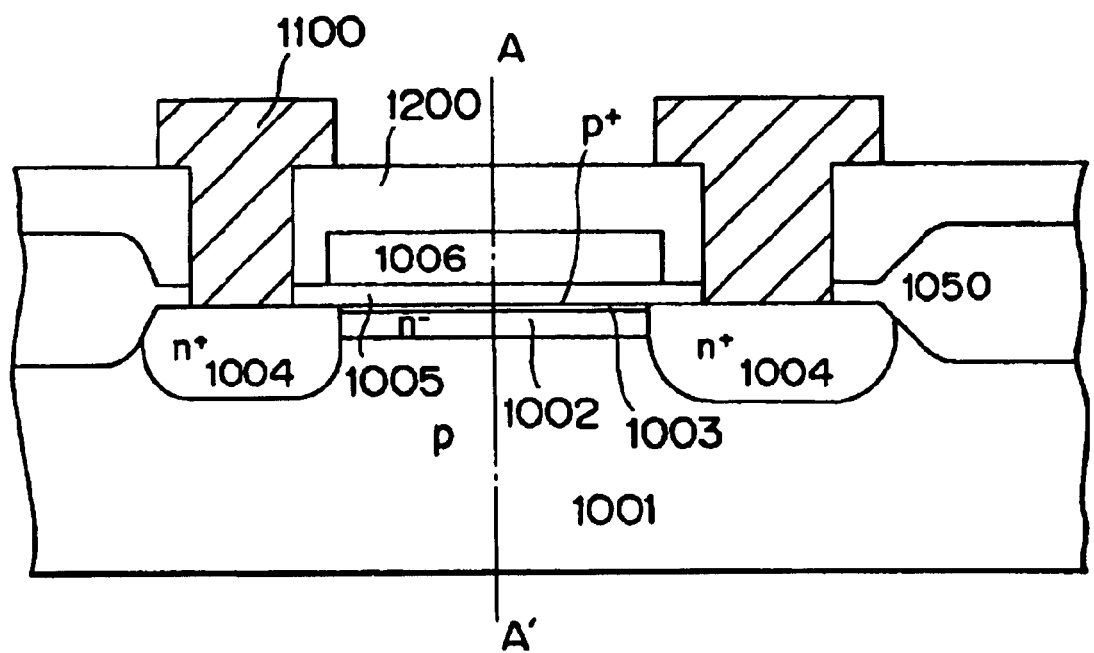
FIG. 7 is a schematic cross-sectional view of a MOS transistor constituting a fourth embodiment of the present invention.

FIG. 7 is a cross-sectional view of a MOS transistor constituting a 4th embodiment of the present invention.

A p-semiconductor substrate 1001 has an impurity concentration of $10^{14} - 10^{18}$ cm$^{-3}$. An n$^-$-area 1002 has an impurity concentration not exceeding $1 \times 10^{17}$ cm$^{-3}$ in order to prevent deterioration of carrier mobility resulting from Coulomb scattering. An area 1003 is given a higher impurity concentration than in the area 1002, in order to prevent the confinement of the inverted carriers in an area in the vicinity of the surface. The impurity concentration of said area 1003 is selected in a range of $10^{15} - 10^{19}$ cm$^{-3}$.

An n$^-$-area 1004, constituting the source or drain of the MOS transistor, has an impurity concentration of $10^{18} - 10^{21}$ cm$^{-3}$.

A gate insulation film 1005 of the MOS transistor is composed of an insulating material such as SiO$_2$, Si$_3$N$_4$, TiO$_2$ or TaO$_2$, or a combination thereof.

A gate electrode 1006 is composed of p$^+$- or n$^+$-polysilicon. Though p$^+$-polysilicon is preferred for a short channel, n$^+$-polysilicon may also be employed. There may also be employed silicide, polycide, metal (highmelting metal) of a combination thereof.

Also there are provided insulation films 1200 for separating the wirings and different layers, and area 1100 constituting ohmic electrodes and wirings for the source and drain, and composed of Al, Sl—Si, Cu, polysilicon or silicide.

FIG. 8 schematically shows the potential distribution along a line A–A' in FIG. 7.

In FIG. 8, carrier electrons are represented by 1020. Also this embodiment is featured by a fact that the carrier electrons 1020 drift in an area separate from the interface between the semiconductor and the insulation film, whereby the carrier scattering resulting from irregularities in said interface can be reduced.

Also the causes for such carrier scattering can be eliminated by the control on the width of carrier drifting area and the impurity concentration therein.

The drain current of a MOS transistor can be approximately represented by the following formulas: in a linear region:

$$I_{DL}=\mu_{eff} W/L \cdot \in_{OX}/T_{OX} \cdot V_D(V_G-V_{th}) \quad (6)$$

in a saturated region:

$$L_{DS}=1/2 \cdot \mu_{eff} W/L \cdot \in_{OX}/T_{OX}(V_G-V_{th})^2 \quad (7)$$

wherein $I_{DL}$, $I_{DS}$: drain currents in linear and saturated regions, $\mu_{eff}$: effective mobility, W: gate width, L: gate length, $\in_{OX}$: dielectric constant of oxide film, $T_{OX}$: thickness of oxide film, $V_D$: drain voltage $V_G$: gate voltage, and $V_{th}$: threshold voltage.

In the MOS transistor subjected to very high scale integration, emphasis is generally given most to the reduction of the gate width L. In combination there are conducted a reduction in the thickness $T_{OX}$ of the oxide film, and an increase in the impurity concentration in the channel area, in order to prevent punch-through between the source and drain, and such increase in the impurity concentration results in a loss in the carrier mobility.

The present embodiment is to improve the carrier mobility $\mu_{eff}$ for increasing the driving power of the device. Also the improvement in $\mu_{eff}$ reduces the drifting time of the carriers, thereby enabling the device to function at a higher speed.

In the following there will be explained the carrier scattering in MOS transistors, in relation to the present embodiment.

The carrier scattering is caused firstly by lattice vibration or phonon, and secondly by impurity ions in the substrate. Under a weak drift electric field, the phonon scattering, as represented by:

$$\mu_L \propto (m^*)^{-5/2} T^{-3/2} \quad (8)$$

is proportional to $-3/2$-th power of temperature T and $-5/2$-th power of effective mass m*. Also the mobility by impurity ion scattering is, as represented by:

$$\mu_i \propto (m^*)^{-1/2} N_I^{-1} T^{3/2} \quad (9)$$

proportional to $T^{3/2}$ and inversely proportional to the concentration $N_I$ of ionized impurity.

The mobility p in the presence of both scatterings is represented by:

$$\mu=(1/\mu_L+1/\mu_i)^{-1} \quad (10).$$

Figure 10:
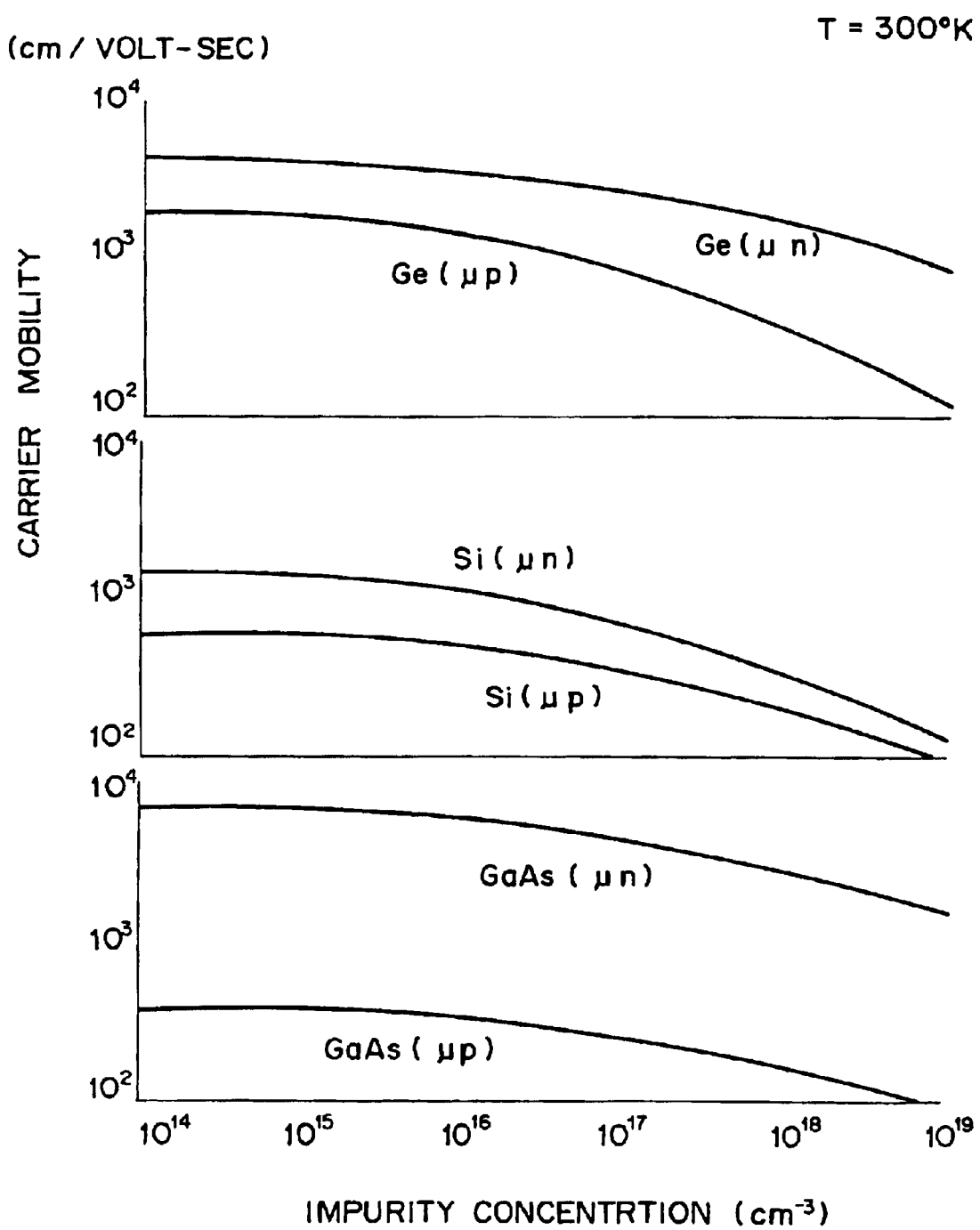
FIG. 10 is charts showing carrier mobility as a function of impurity concentration.

In the low temperature region $\mu_i$ prevails, while $\mu_l$ prevails in the high temperature region. FIG. 10 shows the carrier mobility in various materials as a function of impurity concentration.

As will be apparent from FIG. 10, the mobility specific to each semiconductor can only be obtained at an impurity concentration not exceeding $10^{16}$ cm$^{-3}$, and the mobility is evidently deteriorated at a concentration beyond $10^{17}$ cm$^{-3}$. The foregoing applies to the mobility inside the semiconductor substrate, but there are also other effects in the MOS transistor since it is a surfacial device.

Figure 9A:
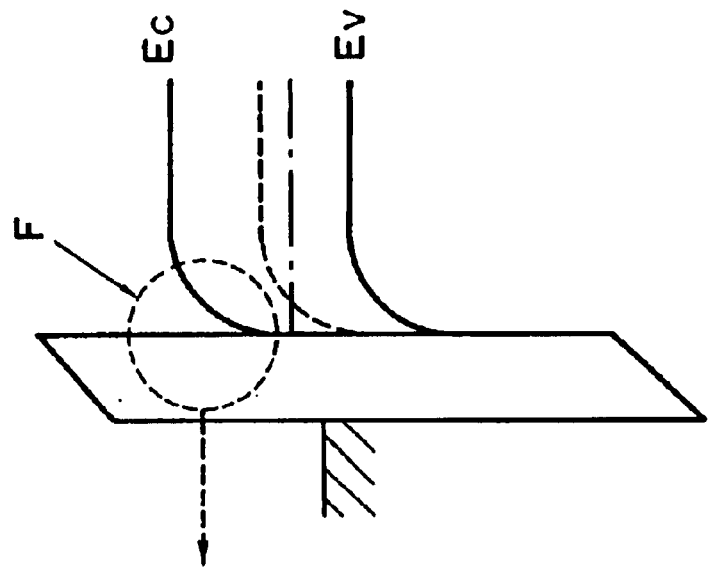
FIGS. 9A and 9B are charts showing kinetic energy.
Figure 9B:
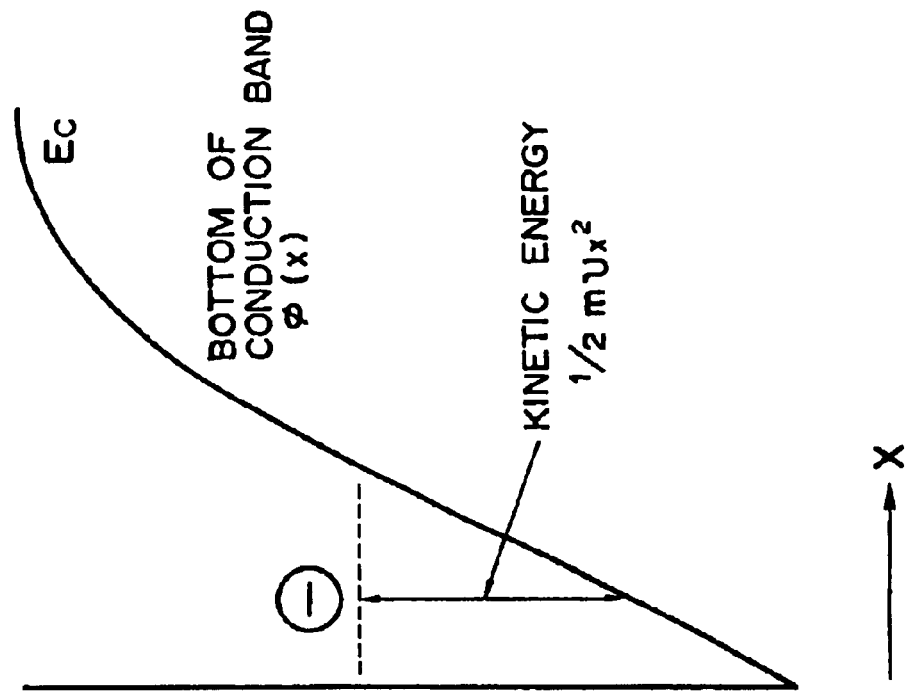

In general, the potential distribution close to the surface of a MOS transistor, in a direction perpendicular to said surface, assumes a form shown in FIG. 9 (wherein FIG. 9A is an enlarged view of a part F in FIG. 9B), wherein the carriers are present in a position corresponding to the sum of potential energy ø(x) and kinetic energy 1/2mvx². Thus the electrons are accelerated in the bottom in the x-direction. The electrons that have acquired a high energy by acceleration by the electric field in the x-direction collide with the surface, thus losing the kinetic energy and returning to the thermal equilibrium state, and are scattered in random manner. For this reason, the mobility of the carriers flowing in the y-direction are deteriorated. This is called the dispersion scattering model, according to which obtained is the following equation:

$$\mu_{SS}/\mu_B=1-\exp(\alpha^2)\{1-\mathrm{erf}(\alpha)\} \quad (11)$$

wherein $\mu_B$ is bulk mobility and $\mu_{SS}$ is dispersion scattering mobility;

$$\alpha=\sqrt{2m^*kT}/qE_x\tau \quad (12)$$

wherein k: Boltzman constant, T: absolute temperature, Ex: perpendicular electric field, and τ: relaxation time. Thus, when the perpendicular electric field Ex increases, the scattering is also increased and the mobility $\mu_{eff}$ is reduced.

Scattering by surface irregularities is also an important mechanism for scattering specific to the surface. The Si—SiO$_2$ interface is not completely flat but shows slight ondulations of a height of several nanometers and a period of about 10 nanometers. Since such ondulations are not negligible in comparison with the wavelength (about 10 nm) of the electron wave at the surface, the electrons are scattered by said ondulations.

Figure 11:
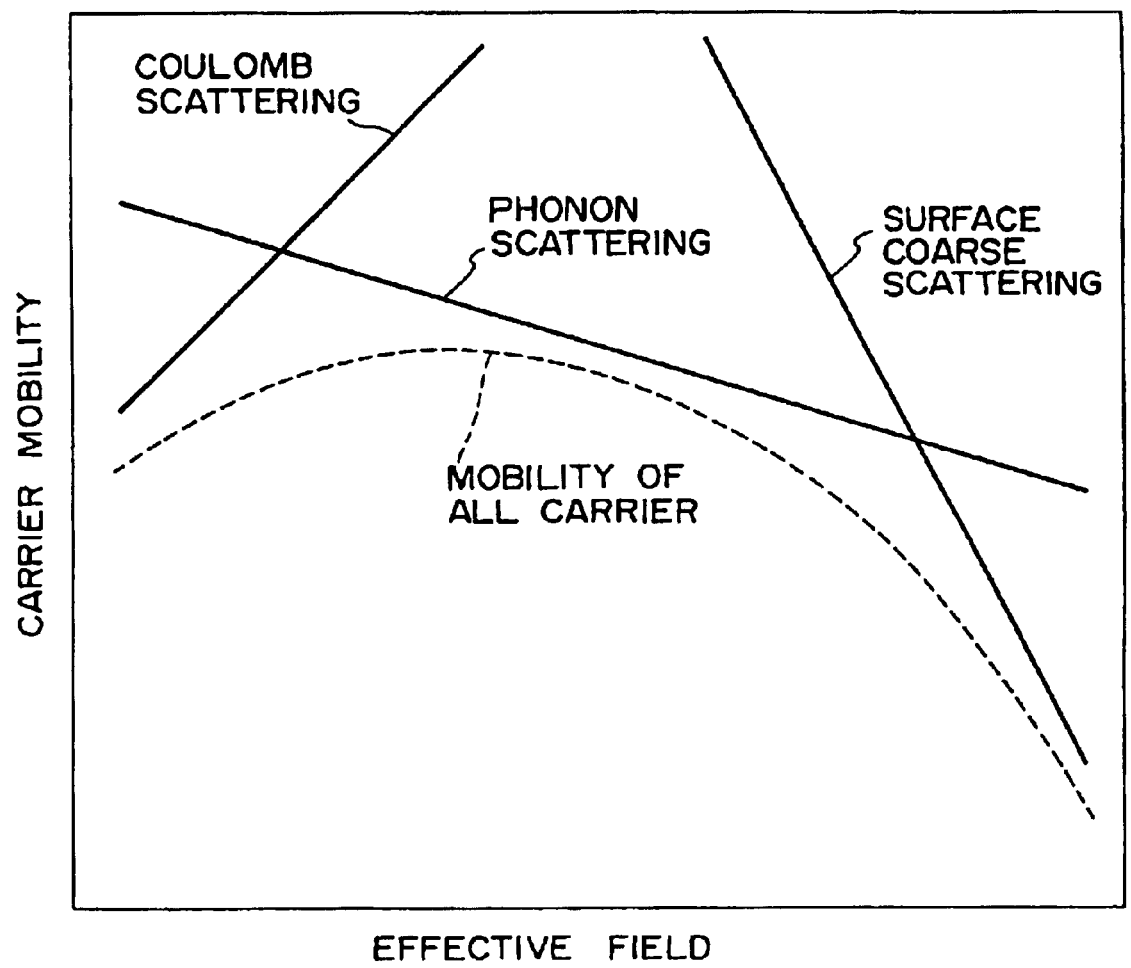
FIG. 11 is a chart showing carrier mobility as a function of effective electric field.

The dependence on electric field is qualitatively shown in FIG. 11. The above-mentioned drawbacks can be resolved by the present invention, and more specifically, by forming an impurity distribution in the gate electrode as shown in FIG. 7 to obtain a potential distribution as shown in FIG. 8, thereby causing the carriers to drift in an area separate from the interface. An essential feature lies in a fact that the carrier drifting area is formed in an area of low impurity concentration. Said impurity concentration is preferably $10^{17}$ cm$^{-3}$ or lower, and more preferably $10^{16}$ cm$^{-3}$ or lower. Such impurity concentration allows to reduce the impurity scattering. The n⁻-area has to be shallower at least than the source and drain in order to prevent punch-through therebetween.

This embodiment provides an enhancement transistor consisting of a normally-off MOS transistor in which the n⁻-area is depleted when the gate voltage is turned off. Different from the buried transistor, the spreading of the depletion layer resulting from the pn junction of semiconductor alone needs to be considered if the gate voltage application to the n-area and the Fermi potentials of the electrode and the semiconductor are not considered. The thickness of the depletion layer spreading in the n-area of pn junction is represented by the foregoing equation (1).

In the present embodiment, which is of n-type, the thickness of the n-area has to satisfy the following relation:

$$x_n(N_D) \leq x_{n1}(N_D, N_{A1})+x_{n2}(N_D, N_{A2}) \quad (13)$$

wherein $N_{A1}$, $N_{A2}$ are p-impurity concentrations in the areas 1001, 1003.

The surfacial p⁺-area with a high impurity concentration should preferably have a thickness of at least 50–100 Å or larger, and said thickness should be at least equal to the mean free path of the driving carriers, in order to reduce the probability of scattering at the interface between SiO$_2$ and Si. The impurity concentration in said area is preferably higher, by at least one digit, than that in the area 1002. The interface between the oxide film and the semiconductor may be in a depleted state or in a neutral state.

The area 1003 is also preferably depleted, since the gate capacitance is reduced to enable faster response. The carrier induction under the application of a voltage to the gate electrode should preferably take place, not in the area 1003, but in the area 1002. As already explained before, in case of an n-area, free carriers can be easily generated if the Fermi level is above the center of the forbidden band. In case of a p-area, there is required a level of $-2\phi_F$ opposite to the inherent Fermi level $\phi_F$ in order to generate electrons which are of the opposite conductive type (cf. FIG. 3).

FIG. 12 shows the ideal distribution of impurity concentration along a cross section A–A' in FIG. 7, and said distribution consists of a surfacial p$^+$-area with a high concentration, a carrier drifing area with a low concentration, and a substrate area with an intermediate concentration (in FIG. 12, solid lines indicate the ideal stepwise distribution while broken lines indicate the actual impurity distribution).

The threshold voltage can approximately determined in the following manner, taking integration $D_I$ of the impurity in two surfacial areas:

$$D_I = \int_0^{x_d} (N_1(x) - N_2(x))\,dx \quad (14)$$

$$\Delta V_{th} = qD_I/C_i \text{ (wherein } C_i = \in_s/T_{ox}) \quad (15)$$

The equation (15) allows to approximately determine the variation in the threshold voltage. This equation stands, however, when the thickness $x_d$ of the depletion layer is larger than $x_2$ and the surfacial p$^+$-layer is depleted. The final threshold value can be represented as:

$$V_{th} = V_{th}(N_3) + \Delta V_{th} + \Delta\phi N_3 N_2 \quad (16)$$

This corresponds to a shift of $V_{th}(N_3)$m determined by the impurity concentration $N_3$ of the substrate, by $\Delta V_{th} \cdot \Delta\phi N_3 N_2$ is a diffusion potential difference at a thermal equilibrium state.

A condition $\Delta V_{th}=0$ can be easily achieved by selecting $N_1$, $N_2$, $x_1$ and $x_2$ so as to attain $D_I=0$. In this state, the $V_{th}$ can be determined by the impurity concentration of the substrate. Also the difference $\phi_{ms}$ in Fermi levels between the semiconductor and the electrode material varies according to said material to be employed, but the threshold value can be accordingly controlled with the thickness and impurity concentration of the surfacial p$^+$-layer, employing the equation (4).

In the following explained is an example of process for producing the semiconductor device shown in FIG. 7.

At first, on a substrate 1001 of p-type $10^{14}$–$10^{18}$ cm$^{-3}$ or on which a p-area is formed for example by diffusion, the n-area 1002 is formed by epitaxy with a thickness of 1 μm or lower and an impurity concentration of $10^{17}$ cm$^{-3}$ or lower.

Then the isolation area 1050 is formed by selective oxidation, and the gate insulation oxide layer 1005 is formed for example by oxidation.

Subsequently ion implantation of BF$_2^+$ is conducted with an acceleration voltage of 5–100 keV and with a dose of 1E11–1E13 cm$^{-2}$, and thermal treatment is conducted by heating at 800°–900° C. or by rapid thermal annealing (RTA) at 950°–1050° C.

Then the gate electrode 1006 is formed by deposition of p$^+$-polysilicon, followed by patterning, and an impurity such as phosphor (P$^+$) or arsenic (As$^+$) is introduced by self-aligned ion implantation utilizing said gate electrode 1006 as the mask and is heat treated by RTA method. Then the insulation film 1200 for interlayer separation is deposited and annealed, and contact holes are opened therein.

Subsequently the metal electrodes are formed by depositing a metal layer by sputtering or by CVD, followed by patterning. The semiconductor device is thus completed.

Most important factors in the present invention are the impurity concentration and thickness of the areas 1002, 1003, and there are preferably employed low temperature epitaxy (800–950° C.), low temperature heat treatment (800–950° C.) and RTA method, in order to maintain the desired impurity distribution.

Figure 13:
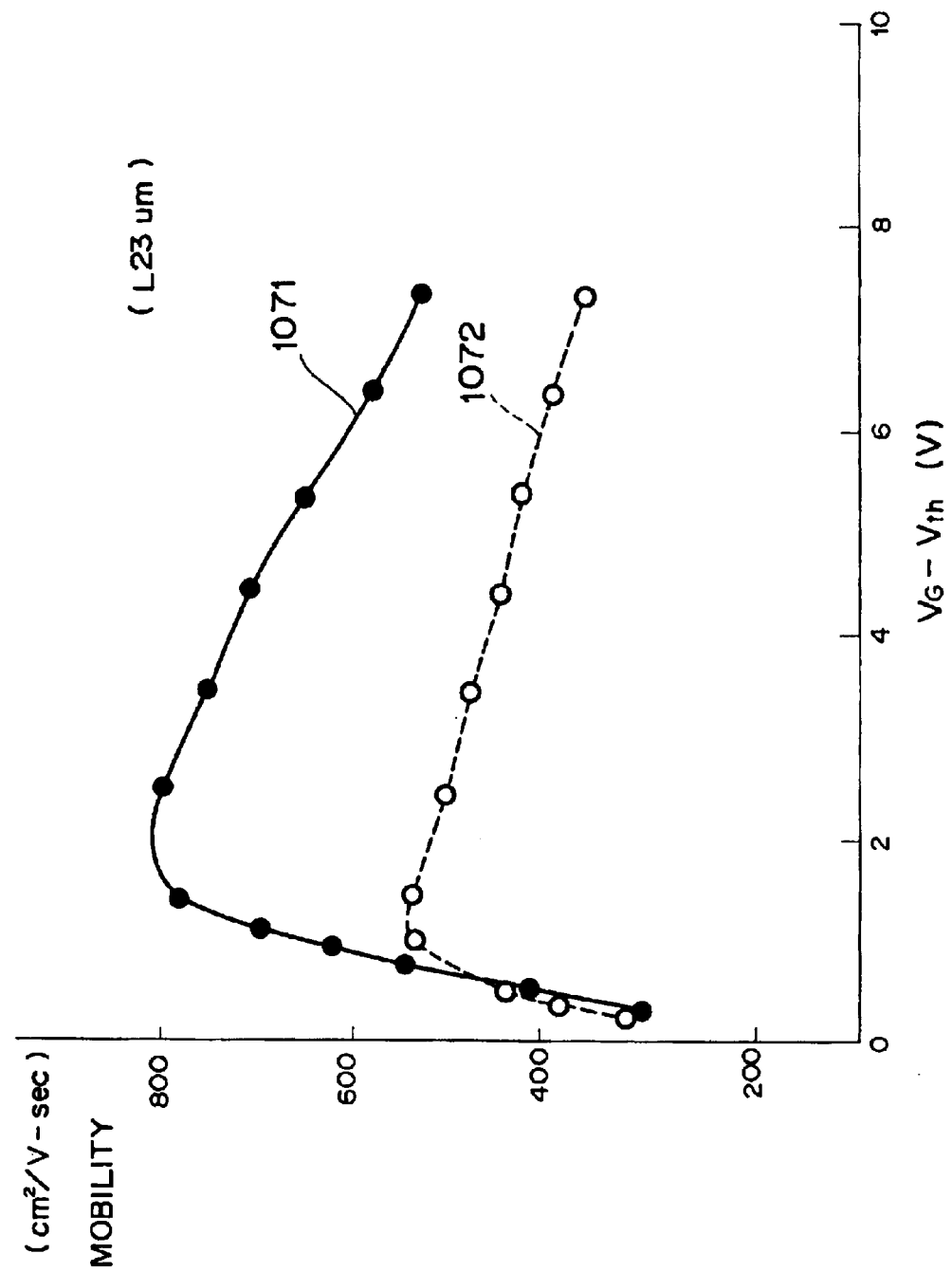
FIG. 13 is a chart showing carrier mobility of MOSFET of the present invention.

FIG. 13 shows the carrier mobility in the MOS FET of the present invention (curve 1071), which is apparently improved in comparison with that of the conventional MOS FET (curve 1072).

Embodiment 5

FIG. 14 is a schematic cross-sectional view of 5th embodiment.

If the impurity concentration in the n$^-$-area is very low (for example less than $10^{15}$ cm$^{-3}$) as in the present embodiment, the n$^-$-area may be formed deeper than the source and the drain because the depletion layer x spreads easily.

In such device structure, it is desirable, as shown in FIG. 14, to form a channel stop area 1010 under the isolation area. The present embodiment drastically reduce the capacitance of the depletion layer x under the source and the drain, thereby enabling high-speed operation. Also this structure provides similar effects to those of the SOI structure.

Embodiment 6

FIG. 15 shows the structure of the present embodiment, further including an n-area 1002' on the area 1002, thereby forming a steeper electric field in the p$^+$n region. However, the n$^-$- and n-areas are both entirely depleted. The areas 1002 and 1002' may be positioned inversely.

Embodiment 7

Figure 16:
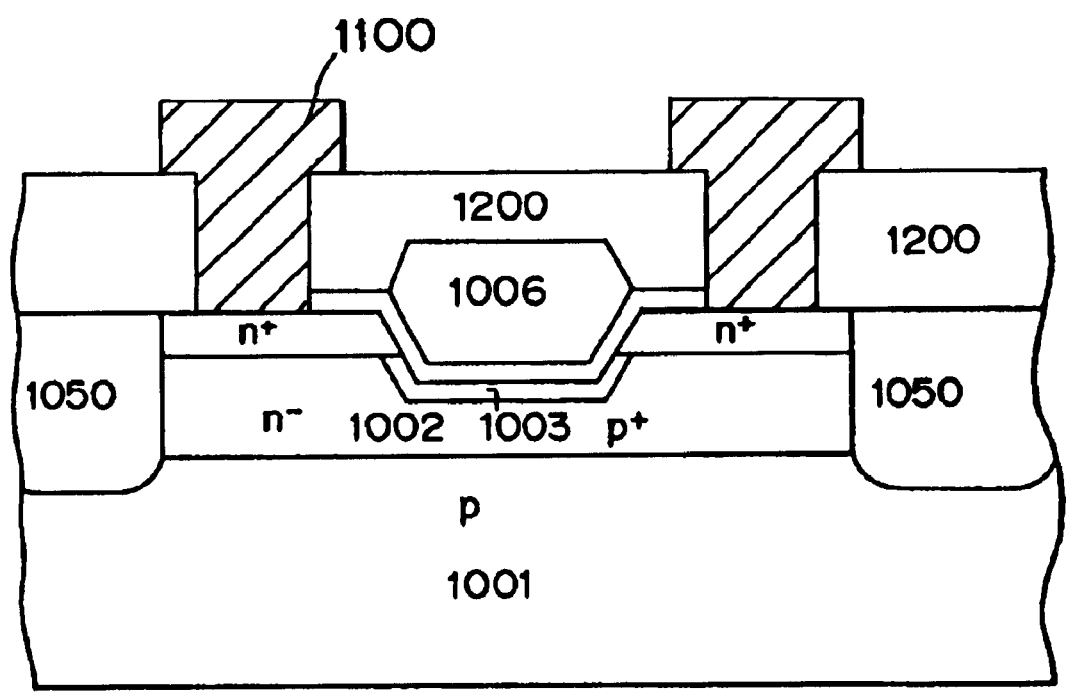
FIG. 16 is a schematic cross-sectional view of a seventh embodiment of the present invention.

FIG. 16 shows an embodiment realized as a recessed MOS transistor. This structure is advantageous for shortening the channel area. As in the 6th embodiment, the n$^-$-area is depleted at least in the channel area.

The foregoing 4th to 7th embodiments have been described by NMOS transistors, but these embodiments are also applicable to PMOS transistors by interchanging the n and p conductive types.

Also these embodiments have been based on silicon, but they are naturally applicable to other materials such as GaAs or GaP.

As explained in the foregoing, the present invention can provide a semiconductor device in which the impurity concentration of the channel is reduced in the carrier conduction area in order to prevent Coulomb scattering.

Also the present invention can provide a semiconductor device in which the dispersion scattering is reduced by a reduction in the intensity of perpendicular electric field in the carrier conduction area and an expansion in the width thereof.

Furthermore, the present invention can provide a semiconductor device in which the carriers are excluded from an area in the vicinity of the interface between the gate insulation film and the semiconductor, in order to prevent the influence of the irregularities in said interface.

Furthermore, the present invention can provide a semiconductor device which is stably mass producible by the use of a thick channel area and still maintains the characteristics of the SOI device.

Also the present invention allows to reduce the interface scattering, dispersion scattering and Coulomb scattering, thereby increasing the carrier mobility, thus increasing the conversion conductance gm and improving the response speed.

In addition there are obtained relaxation of the electric field at the drain side, and reduction in hot carrier generation, whereby achieved are improvements in Kimpf effect and deterioration in the drain breakdown voltage.

Furthermore, there is provided a semiconductor device which can be produced with a high yield and a low cost through the use of a thick channel layer, because of the increased carrier mobility.

Also according to the present invention, the electric field relaxation in the drain side allows to improve the source-drain breakdown voltage. Thus, in a device with a short channel, the generation of hot carriers can be reduced, and the electric field between the gate and the drain can be made gentler.

Furthermore, in contrast to the LDD structure which includes the serial resistance of the n-area in the source side, the structure of the present invention is featured by a lower serial resistance because the n⁻-area is depleted and does not function as the serial resistance.

There is furthermore provided a MOS transistor structure in which the depletion layer spreads to an area below the drain. Such structure reduces the junction capacitance, thereby enabling an ultra-high speed function. Also this structure further improves the drain breakdown voltage.

What is claimed is:

1. A semiconductor device provided at least with source and drain regions of a first conductivity type and a semiconductor layer including a channel region between said source and drain regions, an insulating layer covering at least said channel region, and a gate electrode arranged close to said insulating layer, wherein said channel region comprises a first channel area of a second conductivity type opposite to the first conductivity type and of low resistivity arranged close to said insulating layer, a second channel area of the first conductivity type and of a high resistivity arranged close to said first channel area, and a third channel area of the second conductivity type arranged close to said second channel area, said third channel area is arranged close to an additional insulating layer, and an electrically neutral area is formed in said third channel area at a side adjacent to said additional insulating layer.

2. A semiconductor device according to claim 1, wherein said second channel area is depleted at least when the voltage applied to the gate electrode is zero.

3. A semiconductor device according to claim 1, wherein the thickness of said channel area is larger than the mean free path of the drifting carriers.

4. A semiconductor device according to claim 1, wherein said additional insulating layer is an insulative substrate.

5. A semiconductor device according to claim 4, wherein second said channel is depicted at least when the voltage applied to the gate electrode is zero.

6. A semiconductor device according to claim 4, wherein the thickness of said channel area is larger than the mean free path of the drifting carriers.

* * * * *

UNITED STATES PATENT AND TRADEMARK OFFICE
CERTIFICATE OF CORRECTION

PATENT NO. : 6,784,492 B1
DATED : August 31, 2004
INVENTOR(S) : Masakazu Morishita It is certified that error appears in the above-identified patent and that said Letters Patent is hereby corrected as shown below:

Drawings,
SHEET 10, FIG. 10, "CONCENTRTION" should read -- CONCENTRATION --.

Column 2,
Line 14, "parasite" should read -- parasitic --.

Column 3,
Line 33, "phosphor." should read -- phosphorus --.

Column 4,
Line 14, "$\in_s$:" should read -- $\varepsilon_s$: --; and
Line 51, "p⁻-area" should read -- $p^+$-area --.

Column 5,
Line 15, "$V_{th}V_{th}(N_3)$" should read -- $V_{th} = V_{th}(N_3)$ --; and
Line 54, "phosphor" should read -- phosphorus --.

Column 6,
Line 36, "An n⁻-area" should read -- ¶ An n⁻-area --; and
Line 45, "n⁻-area" should read -- $n^+$-area --.

Column 7,
Line 50, "p" should read -- $\mu$ --.

Column 8,
Lines 27 and 28, "ondulations" should read -- undulations --; and
Line 31, "ondulations." should read -- undulations. --.

Column 9,
Line 23, "can" should read -- can be --.

Column 10,
Line 3, "phosphor" should read -- phosphorus --;
Line 23, "of" should read -- of a --; and
Line 32, "reduce" should read -- reduces --.

UNITED STATES PATENT AND TRADEMARK OFFICE
CERTIFICATE OF CORRECTION

PATENT NO. : 6,784,492 B1
DATED : August 31, 2004
INVENTOR(S) : Masakazu Morishita It is certified that error appears in the above-identified patent and that said Letters Patent is hereby corrected as shown below:

<u>Column 12,</u>
Line 25, "said" should read -- said first --;
Line 29, "second said channel is depicted" should read -- said second channel area is depleted --; and
Line 32, "said" should read -- said first --.

Signed and Sealed this

Eighteenth Day of October, 2005

JON W. DUDAS
*Director of the United States Patent and Trademark Office*